US010996558B2

(12) United States Patent
Yu et al.

(10) Patent No.: US 10,996,558 B2
(45) Date of Patent: May 4, 2021

(54) MULTIPLE-MASK MULTIPLE-EXPOSURE LITHOGRAPHY AND MASKS

(71) Applicant: Taiwan Semiconductor Manufacturing Co., Ltd., Hsinchu (TW)

(72) Inventors: Peter Yu, Hsinchu (TW); Chih-Tung Hsu, Hsinchu (TW); Kevin Wang, Hsinchu (TW); Chih-Chia Hu, Hsinchu (TW); Roger Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

(21) Appl. No.: 16/658,909

(22) Filed: Oct. 21, 2019

(65) Prior Publication Data

US 2020/0050102 A1 Feb. 13, 2020

Related U.S. Application Data

(62) Division of application No. 15/800,140, filed on Nov. 1, 2017, now Pat. No. 10,620,530.

(60) Provisional application No. 62/539,063, filed on Jul. 31, 2017.

(51) Int. Cl.
*G03F 1/70* (2012.01)
*G03F 1/42* (2012.01)
*G03F 1/38* (2012.01)

(52) U.S. Cl.
CPC .............. *G03F 1/70* (2013.01); *G03F 1/38* (2013.01); *G03F 1/42* (2013.01)

(58) Field of Classification Search
CPC ................ G03F 1/38; G03F 1/42; G03F 1/70

USPC ............................................................ 430/5
See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2005/0095509 A1 | 5/2005 | Zhang et al. |
| 2011/0059391 A1 | 3/2011 | Shoki |
| 2013/0236835 A1 | 9/2013 | Lam |
| 2019/0033706 A1 | 1/2019 | Yu et al. |

FOREIGN PATENT DOCUMENTS

| | | |
|---|---|---|
| CN | 102063015 | 5/2011 |
| KR | 100484023 | 4/2005 |
| KR | 20090114037 | 11/2009 |
| KR | 20150046212 | 4/2015 |
| KR | 20150058455 | 5/2015 |
| TW | 200801829 | 1/2008 |
| TW | 201418870 | 5/2014 |
| TW | 201428433 | 7/2014 |

*Primary Examiner* — Christopher G Young
(74) *Attorney, Agent, or Firm* — Haynes and Boone, LLP

(57) ABSTRACT

Examples of a multiple-mask multiple-exposure lithographic technique and suitable masks are provided herein. In some examples, a photomask includes a die area and a stitching region disposed adjacent to the die area and along a boundary of the photomask. The stitching region includes a mask feature for forming an integrated circuit feature and an alignment mark for in-chip overlay measurement.

20 Claims, 18 Drawing Sheets

MULTIPLE-MASK MULTIPLE-EXPOSURE LITHOGRAPHY AND MASKS

PRIORITY DATA

The present application is a divisional application of U.S. application Ser. No. 15/800,140, filed Nov. 1, 2017, which claims the benefit of U.S. Provisional Application No. 62/539,063, entitled "Multiple-Mask Multiple-Exposure Lithography and Masks," filed Jul. 31, 2017, each of which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

As merely one example, advances in lithography have enabled the formation of increasingly complex circuits. In general, lithography is the formation of a pattern on a target. In one type of lithography, referred to as photolithography, radiation such as ultraviolet light passes through or reflects off a mask before striking a photoresist coating on the target. The photoresist includes one or more components that undergo a chemical transition when exposed to radiation. A resultant change in property allows either the exposed or the unexposed portions of the photoresist to be selectively removed. In this way, photolithography transfers a pattern from the mask onto the photoresist, which is then selectively removed to reveal the pattern. The target then undergoes processing steps that take advantage of the shape of the remaining photoresist to create features on the target.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
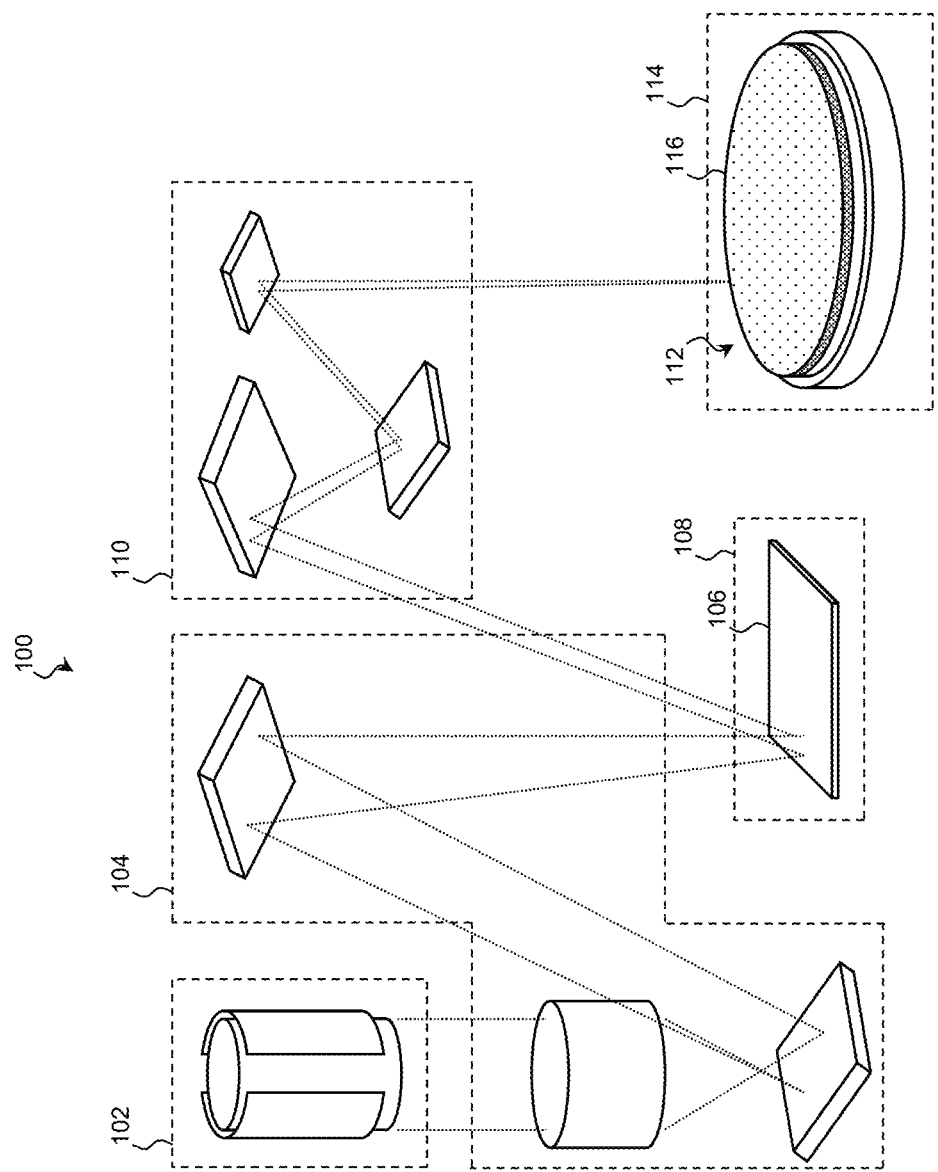
FIG. 1 is a block diagram of a lithography system according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Masks (i.e., photomasks) are used in many integrated circuit fabrication processes to expose a photoresist on an integrated circuit workpiece to light and, by selectively removing the exposed or unexposed regions of the photoresist, to selectively process corresponding portions of the workpiece. The amount of the workpiece that can be exposed by any given mask may depend on the mask size, the reticle size, and/or other properties of the mask or lithographic system used to expose the workpiece. In many examples, the size of the exposed area sets a limit on the maximum size of an integrated circuit that can be formed using the mask and/or lithographic system. In order to fabricate a circuit that is larger than a given exposed area, some embodiments of the present disclosure provide a set of masks and a technique for exposing a single photoresist using different masks at different locations to form a single monolithic integrated circuit.

So that features formed by the masks in a multiple-mask multiple-exposure process align correctly, each mask may include alignment marks along an interface with an adjacent mask. Alignment of the masks may be verified and corrected by measuring the distance and/or skew between a first alignment feature formed by a first mask and a second alignment feature formed by a second mask, and suitable alignment feature patterns include box-in-box, cross-in-cross, and test-line-type alignment marks. In an example of a 4-mask set, a first mask includes alignment regions set aside within the die region for alignment marks along an interface with a second mask and alignment regions in the field set aside for alignment marks along an interface with a third mask. Likewise, a second mask includes alignment regions along an interface with the first mask and alignment regions along an interface with a fourth mask, and so on. The alignment regions and alignment marks are not limited to the frame surrounding the die region of a mask, and the alignment marks may be formed within the final circuit. Some examples provide a technique for dividing a layout into individual masks for a multiple-mask multiple-exposure process. Some examples provide a technique for verifying and correcting alignment during a multiple-mask multiple-exposure process. In this way, many embodiments allow for the formation of integrated circuits that are larger than the exposed area of any single mask.

FIG. 1 is a block diagram of a lithography system 100 according to various embodiments of the present disclosure. The lithography system 100, which may also be generically referred to as a scanner, is operable to perform a lithographic exposure process utilizing a characteristic radiation source and exposure mode. In the illustrated embodiments, the lithography system 100 is an extreme ultraviolet (EUV) lithography system designed to expose a workpiece using EUV radiation having a wavelength ranging between about 1 nm and about 100 nm. In some exemplary embodiments, the lithography system 100 includes a radiation source 102 that generates EUV radiation with a wavelength centered at about 13.5 nm. In one such embodiment, an EUV radiation source 102 utilizes laser-produced plasma (LPP) to generate the EUV radiation by heating a medium such as droplets of tin into a high-temperature plasma using a laser.

The lithography system 100 may also include an illuminator 104 that focuses and shapes the radiation produced by the radiation source 102. The illuminator 104 may include refractive optical components, including monolithic lenses and/or array lenses (e.g., zone plates), and may include reflective optical components, including monolithic mirrors and/or mirror arrays. The number of optical components shown FIG. 1 have been reduced for clarity, although in actual embodiments, the illuminator 104 includes dozens or even hundreds of lenses and/or mirrors. The optical components are arranged and aligned to project radiation emitted by the radiation source 102 onto a mask 106 retained in a mask stage 108. An exemplary mask 106 will be described in further detail in the context of FIG. 2. The optical components of the illuminator 104 may also shape the radiation along the light path in order to produce a particular illumination pattern upon the mask 106.

After passing through or reflecting off the mask 106, the radiation is directed through a projection optics module 110, also referred to as a Projection Optics Box (POB). Similar to the illuminator 104, the projection optics module 110 may include refractive optical components, including monolithic lenses and/or array lenses (e.g., zone plates), and may include reflective optical components, including monolithic mirrors and/or mirror arrays. The optical components of the projection optics module 110 are arranged and aligned to direct radiation transmitted through or reflecting off the mask 106 and to project it onto a workpiece 112, such as the illustrated semiconductor substrate or any other suitable workpiece, retained in a substrate stage 114. In addition to guiding the radiation, the optical components of the projection optics module 110 may also enlarge, narrow, focus, and/or otherwise shape the radiation along the light path.

Radiation projected by the projection optics module 110 on the workpiece 112 causes changes in a photosensitive component of the target. In an example, the workpiece 112 includes a semiconductor substrate with a photoresist 116. Portions of the photoresist 116 that are exposed to the radiation undergo a chemical transition making them either more or less sensitive to a developing process. In some examples, a single photoresist 116 is exposed using more than one mask 106 and more than one exposure in the course of forming a single integrated circuit. Portions of the photoresist 116 exposed by one mask may abut or be interleaved with portions of the photoresist 116 exposed by another mask. In an exemplary embodiment, after the exposures, the photoresist 116 undergoes a post-exposure baking, developing, rinsing, and drying in order to complete the transition. Subsequent processing steps performed on the workpiece 112 may use the pattern of the remaining photoresist 116 to selectively process portions of the workpiece 112.

Figure 2:
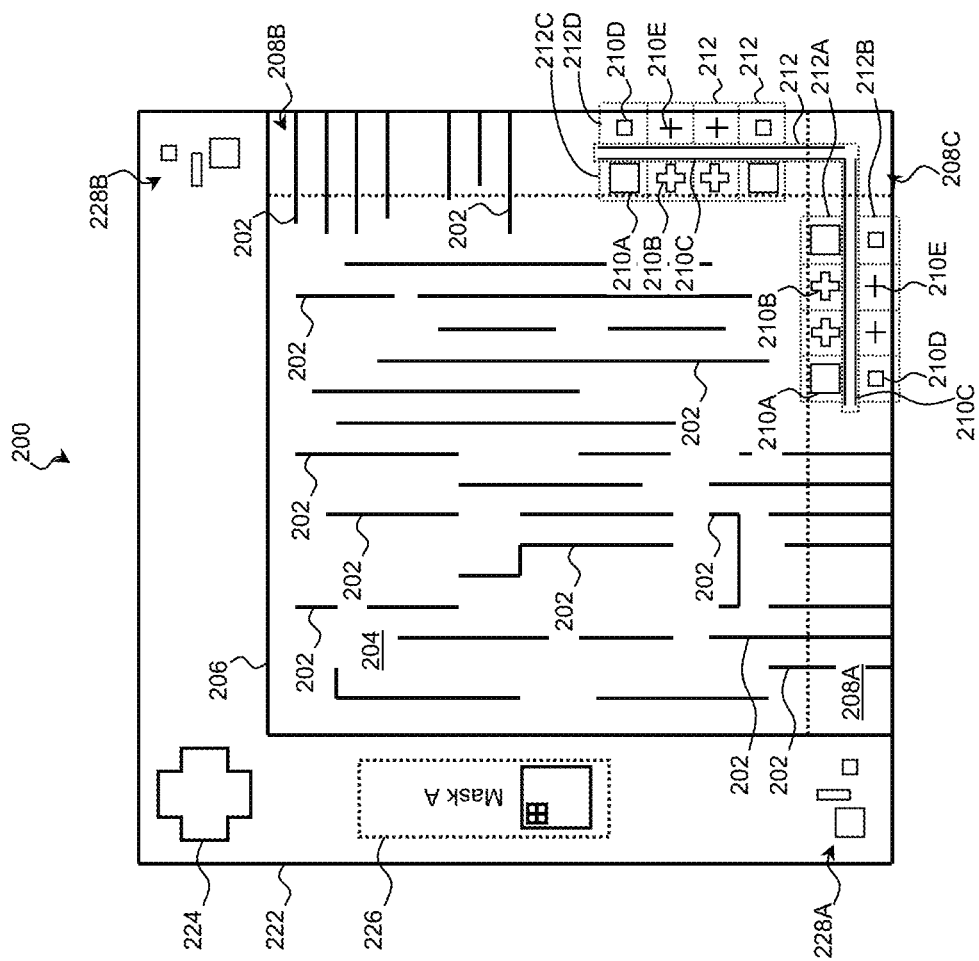
FIG. 2 is a top view diagram of a mask for integrated circuit manufacturing according to various embodiments of the present disclosure.

FIG. 2 is a top view diagram of a mask 200 for integrated circuit manufacturing according to various embodiments of the present disclosure. The mask 200 includes mask features 202 that are used to define features of an integrated circuit by either exposing or not exposing corresponding areas on the integrated circuit workpiece to light. In examples where the mask 200 is a reflective mask 200, mask features 202 may be reflective regions disposed in a non-reflective field 204 or non-reflective regions disposed in a reflective field 204. In examples where the mask 200 is a transmissive mask 200, mask features 202 may be transmissive regions disposed in an absorptive field 204 or absorptive regions disposed in a transmissive field 204. In FIG. 2, the mask features 202 are enlarged and the number of mask features 202 has been reduced for clarity because a typical mask 200 may include billions of mask features 202.

The mask features 202 are used to form functional features of an integrated circuit device (e.g., features that contribute to the operation of the integrated circuit). In various examples, the mask features 202 of a given mask 200 represent and define the same type of circuit device feature (e.g., doped wells, doped active regions, device gates, contacts, interconnect lines, interconnect vias, etc.) because each of the mask features 202 exposes the same photoresist on the integrated circuit workpiece in the same exposure process. Other types of features and features in other layers are formed by other masks in the set.

Furthermore, in order to form larger circuits, many embodiments provide a mask set with masks 200 configured to be used in a multiple-mask multiple-exposure process where a single photoresist is exposed by more than one different mask to form a single monolithic circuit that includes circuit features formed by more than one mask. In this way, the size of the circuit is not limited by the area exposed using a single mask. The mask 200 of FIG. 2 is configured to be used with at least three other masks to form a single circuit, although further examples are suitable for use with any number of other masks.

The mask 200 includes a main die area 206 that contains any number of mask features 202. The mask features 202 in the main die area 206 correspond to circuit features to be formed, and when forming the circuit features, the area exposed by the main die area 206 does not overlap with the exposed area of any other mask in the multiple-mask multiple-exposure process.

The mask 200 may also include other areas where the corresponding exposure area overlaps with that of other masks. For example, the areas exposed by stitching regions 208A and 208B overlap with areas exposed by stitching regions of other masks used in the multiple-mask multiple-exposure process. In some such examples, features within a stitching region (e.g., region 208A and/or 208B) are exposed twice or more by the masks that overlap along the stitching region. As will be shown in more detail below, the corresponding mask features 202 within the stitching region may be reduced in size so that the total exposure of the multiple exposures is comparable to that of a mask feature 202 in the main die area 206 that is exposed in a single exposure process. Additionally or in the alternative, the mask features 202 within a stitching region (e.g., region 208A and/or 208B) may be allocated between masks 200 so that each feature 202 is contained within a single mask and that no feature is exposed using more than one mask.

Depending in part on the type of circuit feature formed by the mask 200 and other process factors, mask features 202 in the stitching regions 208A and 208B of the mask 200 may couple to mask features in the main die area 206 of other masks. For example, in order to connect conductive lines across masks, the corresponding mask features may couple. However in some embodiments, other types of circuit features (e.g., active regions) are not permitted to extend between masks, and the corresponding masks do not permit coupling of mask features 202.

To prevent feature conflicts, mask features 202 that correspond to functional circuit shapes may be prohibited in some stitching regions of the mask 200 (e.g., stitching region 208C). For example, in some embodiments, stitching region 208C overlaps with the exposure areas of three other masks, and to simplify the lithographic process, mask features 202 are not permitted in this region.

Because of the interplay between mask features 202 of the different masks, the alignment of the masks involved in the multiple-mask multiple-exposure process is important to the integrity of the final circuit. Accordingly, the mask 200 may include alignment marks (e.g., alignment marks 210A, 210B, 210C, 210D, and/or 210E) within the stitching regions 208A, 208B, and/or 208C for an in-chip overlay measurement process. In contrast to an inter-level overlay measurement process where alignment features formed by a first mask in a first layer of the workpiece are compared with alignment features formed by a second mask in a second layer, in-chip overlay measurement compares alignment features formed by different masks in the same layer as part of a multiple-mask multiple-exposure process. To prevent conflicts between the alignment marks 210A-210E and the mask features 202 within the stitching regions 208A and 208B, the alignment marks 210A-210E may be contained within alignment regions 212, including alignment regions 212A-212D. Mask features 202 that form functional circuit features may be prohibited in the alignment regions 212. In the examples of FIG. 1, alignment regions 212A and 212B are designated for in-chip alignment with a first adjacent mask that exposes a region immediately below and overlapping with that of the mask 200, and alignment regions 212C and 212D are designated for in-chip alignment with a second adjacent mask that exposes a region immediately to the right and overlapping with that of the mask 200.

The alignment marks for the in-chip overlay measurement process may be similar to or different from alignment marks used in an inter-level overlay measurement process and may include box-in-box patterns, cross-in-cross patterns, parallel or abutting test lines, and/or any other suitable type of alignment mark. In various examples, the stitching region 208A includes one or more alignment marks 210A of a first type, such as outer boxes of box-in-box alignment mark sets, and/or one or more alignment marks 210B of a second type, such as outer crosses of cross-in-cross alignment mark sets. In that regard, the stitching region 208A may include any number of alignment marks of the first type aligned in parallel with a boundary between the mask 200 and the first adjacent mask, which the marks of the stitching region 208A are used to align with.

Similarly, the stitching region 208A may include one or more alignment marks of a second type, such as alignment marks 210D, which represent inner boxes of box-in-box alignment mark sets; alignment marks 210E, which represent inner crosses of cross-in-cross alignment mark sets; test line alignment marks; and/or other suitable alignment marks. The stitching region 208A may include any number of alignment marks of the second type aligned in parallel with a boundary between the mask 200 and the first adjacent mask, which the alignment marks are used to align with.

Additionally or in the alternative, the stitching region 208A may include alignment marks of other types such as alignment mark 210C, which includes a test line configured to run in parallel with a test line of the first adjacent mask and/or to abut a test line of the first adjacent mask.

Stitching region 208B may be structured similarly to align with the second adjacent mask. In that regard, the stitching region 208B may include any number of alignment marks (e.g., alignment marks 210A, 210B, 210C, 210D, and 210E and/or other suitable alignment marks), some of which may be aligned in parallel with the boundary between the mask 200 and the second adjacent mask, which the alignment marks are used to align with.

Beyond the main die area 206, the stitching regions, and the alignment regions, the mask 200 may include a frame area 222. The frame area 222 may include scribe lines (sacrificial areas set aside for dicing the wafer), inter-level alignment marks 224, and/or other fiducial features 226 (markings that are not part of an integrated circuit but are nonetheless a part of the mask such as logos and text).

The frame area 222 may also include frame-area in-chip alignment marks 228, including alignment marks 228A and 228B, which may be substantially similar to alignment marks 210A-210E in the alignment regions. In that regard, alignment marks 228A may be designated for in-chip alignment with a first adjacent mask that exposes a region immediately below and overlapping with that of the mask 200, similar to those of alignment regions 212A and 212B. Alignment marks 228B may be designated for in-chip alignment with a second adjacent mask that exposes a region immediately to the right and overlapping with that of the mask 200, similar to those of alignment regions 212C and 212D. In various examples, the frame-area in-chip alignment marks 228A and 228B include box-in-box alignment marks, cross-in-cross alignment marks, test lines intended to be parallel with or to abut test lines of other masks, and/or other suitable alignment marks. In this way, the frame-area in-chip alignment marks 228 provide additional reference points for aligning the masks of the multiple-mask multiple-exposure process.

Figure 3:
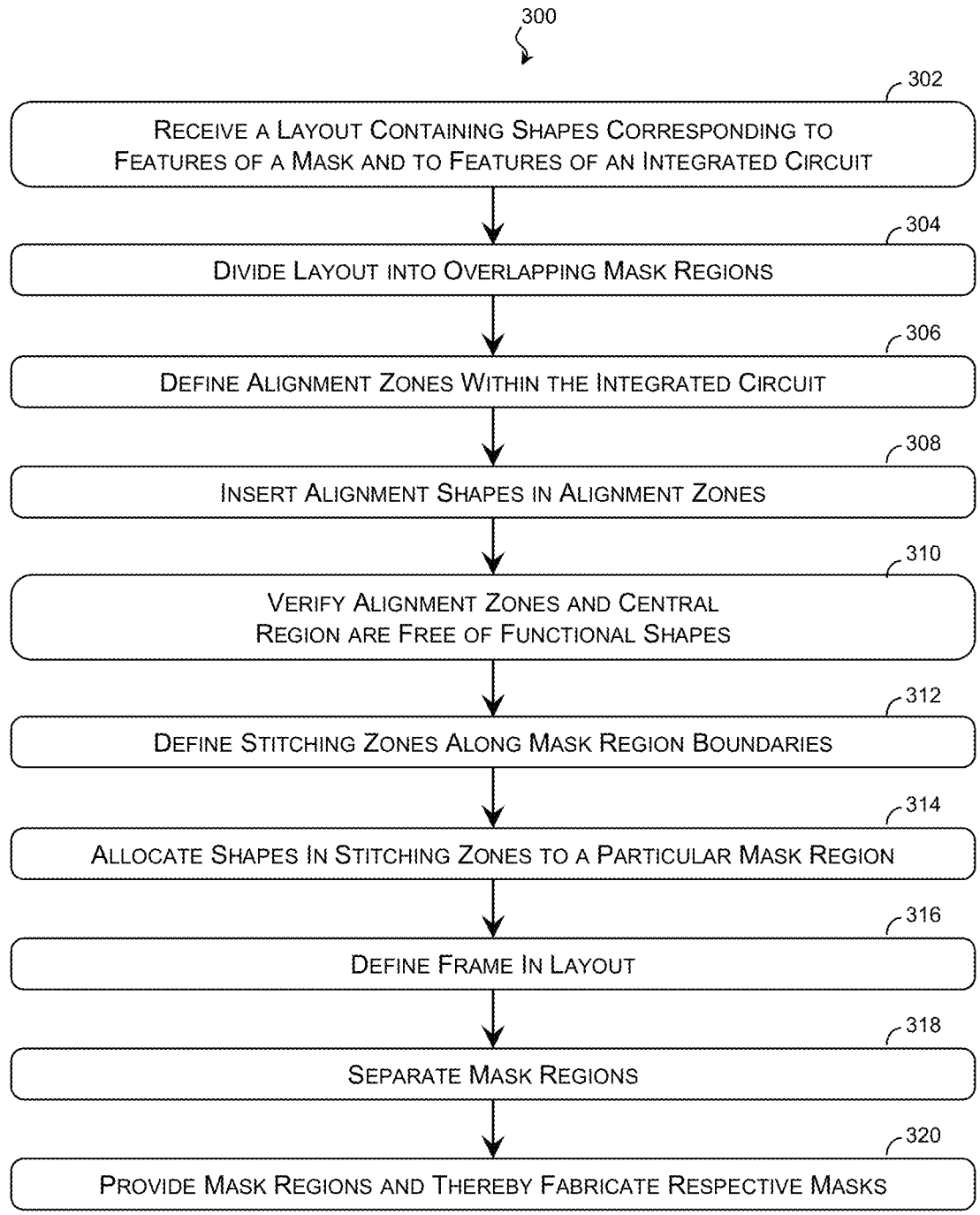
FIG. 3 is a flow diagram of a method of forming a mask set from a layout according to various embodiments of the present disclosure.

A technique for forming the mask 200 from a layout is described with reference to FIGS. 3-8. In that regard, FIG. 3 is a flow diagram of a method 300 of forming a mask set from a layout according to various embodiments of the present disclosure. Additional steps can be provided before, during, and after the method 300, and some of the steps described can be replaced or eliminated for other embodiments of the method 300. FIGS. 4-8 are diagrams of a layout 400 undergoing the method 300 of mask formation according to various embodiments of the present disclosure. As the layout 400 may contain millions or billions of shapes, the illustrations of the layout 400 have been simplified for clarity.

Figure 4:
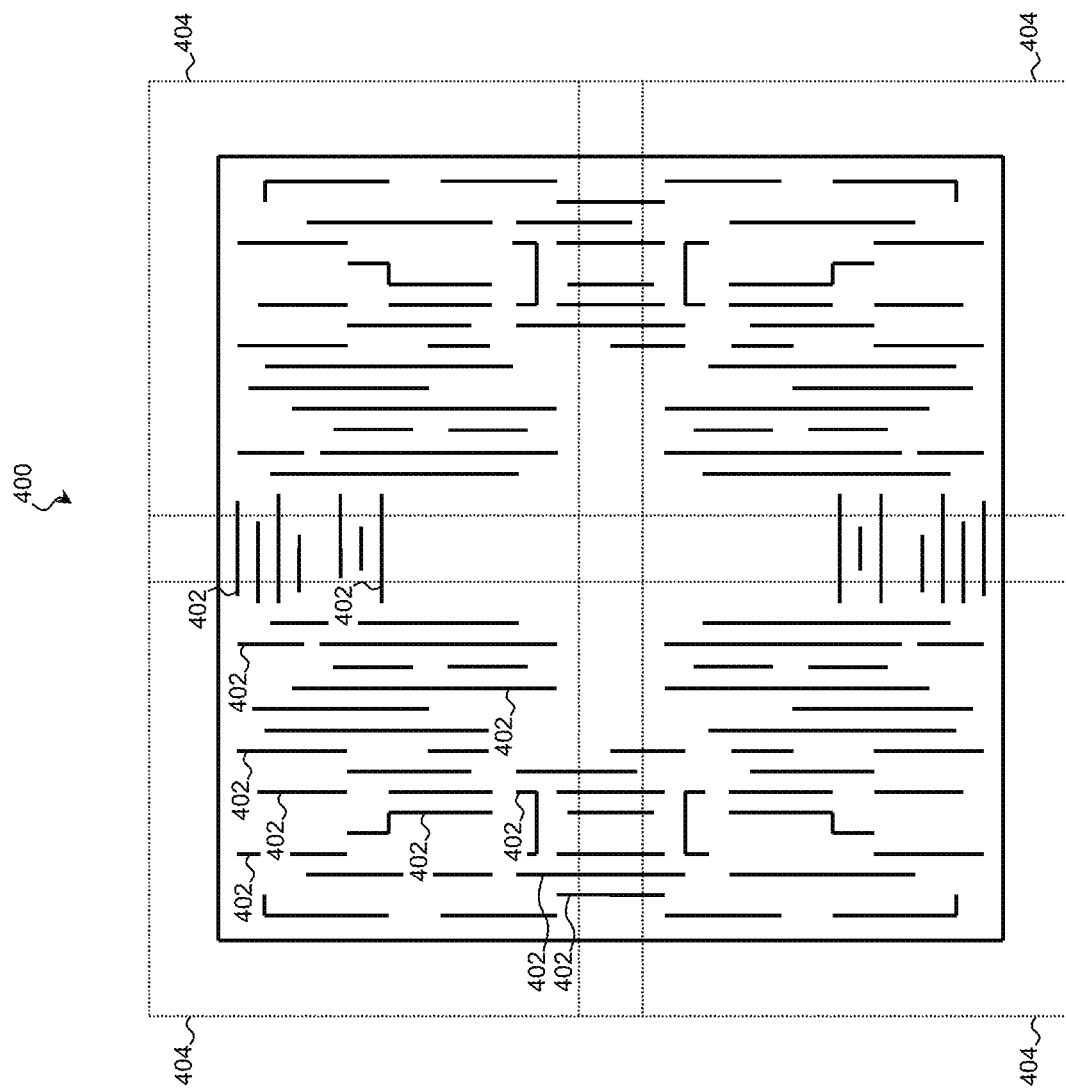
FIGS. 4-8 are diagrams of a layout undergoing a method of mask formation according to various embodiments of the present disclosure.

Referring first to block 302 of FIG. 3 and to FIG. 4, a layout 400 is received for fabrication. In various examples, the layout 400 takes the form of a data file stored on a non-transitory computer-readable medium and is represented in a design standard such as GDSII, OASIS, and/or MEBES®, a registered trademark of Applied Materials. The layout 400 may be a digital representation of an integrated circuit, and shapes 402 of the layout 400 may correspond to and define physical features of masks and, by extension, features of an integrated circuit to be formed by the masks.

The shapes 402 of the layout 400 correspond to features (e.g., doped wells, doped active regions, device gates, contacts, interconnect lines, interconnect vias, etc.) of an integrated circuit, and in some examples, integrated circuit defined by the layout 400 is to be formed by multiple masks in a multiple-mask multiple-exposure process. Accordingly, referring to block 304 of FIG. 3 and to FIG. 4, the layout 400 is subdivided into mask regions 404 such that each mask region 404 corresponds to a discrete mask. The layout 400 may be subdivided into any suitable number of mask regions 404 based on the size of the corresponding integrated circuit; mask size; reticle size; other properties of the circuit, mask, or lithographic system; and/or other suitable factors. In an example, the layout 400 is subdivided into four mask regions 404. The mask regions 404 may overlap along intersections between masks.

Figure 5:
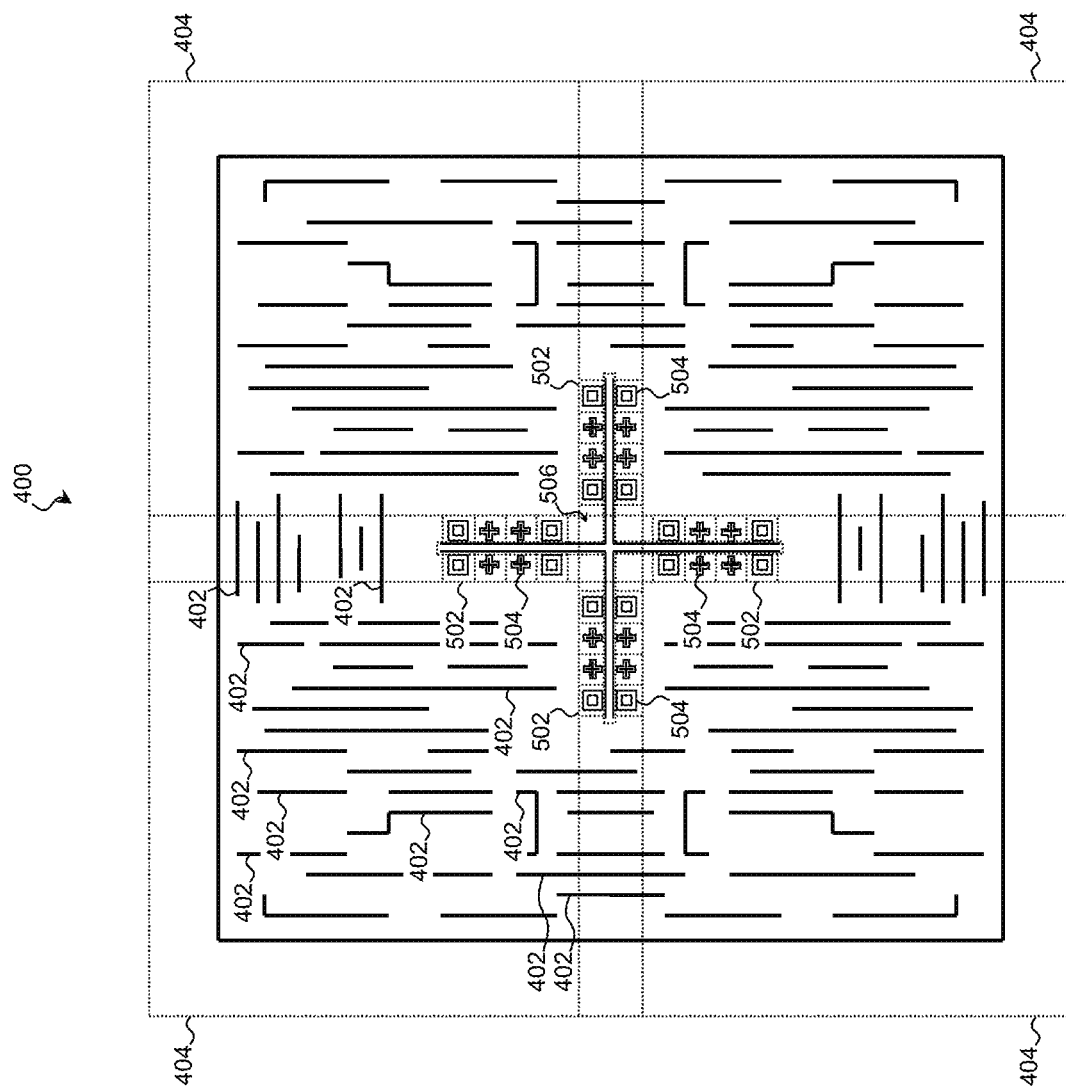

Referring to block 306 of FIG. 3 and to FIG. 5, alignment zones 502 are defined along the intersections of the mask regions 404. The alignment zones 502 include reserved areas for alignment shapes, and in contrast with a mask frame, which may also include alignment shapes, the alignment zones 502 may lie within the integrated circuit defined by the layout 400. As layout shapes 402 may be prohibited in the alignment zones 502, the number and size of the alignment zones 502 may be balanced against the size of the area remaining available to layout shapes 402.

Referring to block 308 and referring still to FIG. 5, alignment shapes 504 are inserted into the alignment zones 502 of the layout 400. Suitable alignment shapes 504 include box-in-box shapes, cross-in-cross shapes, and test-lines, and many alignment shapes 504 operate as a set with one alignment shape 504 (e.g., an inner shape) allocated to a first mask and mask region 404 and a second alignment shape 504 (e.g., an outer shape) allocated to a second mask and mask region 404. In some such examples, adding a box-in-box alignment shape 504 includes adding an outer box to a first mask region 404 and an inner box to a second mask region 404 such that the inner box is formed within the outer box. In some such examples, adding a cross-in-cross alignment shape 504 includes adding an outer cross to a first mask region 404 and an inner cross to a second mask region 404 such that the inner cross is formed within the outer cross. In some such examples, adding a test line alignment shape 504 includes adding a first test line of a set of parallel or abutting test lines to a first mask region and a second test line of the set to a second mask region 404.

In some examples, to protect the integrity of the alignment shapes 504, functional layout shapes 402 are prohibited in the alignment zones 502. Similarly, layout shapes 402 may be prohibited within a central region 506 where more than two mask regions 404 overlap. Referring to block 310 of FIG. 3, the layout 400 is checked to ensure that no functional shapes 402 are located within the alignment zones 502 or within the central region 506. If a functional shape 402 is found in an alignment zone 502 or the central region 506, an alert may be triggered.

Figure 6A:
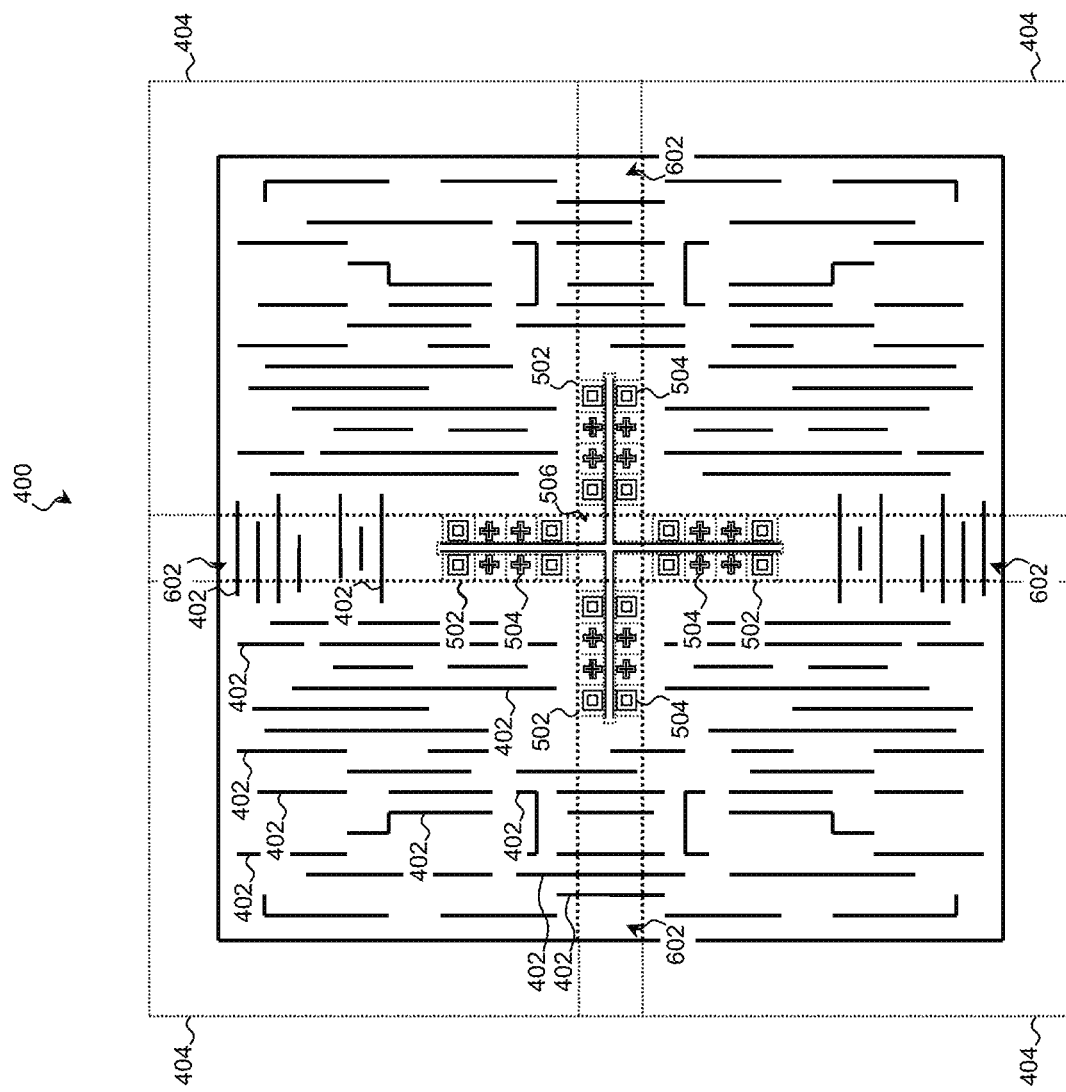
Figure 6B:
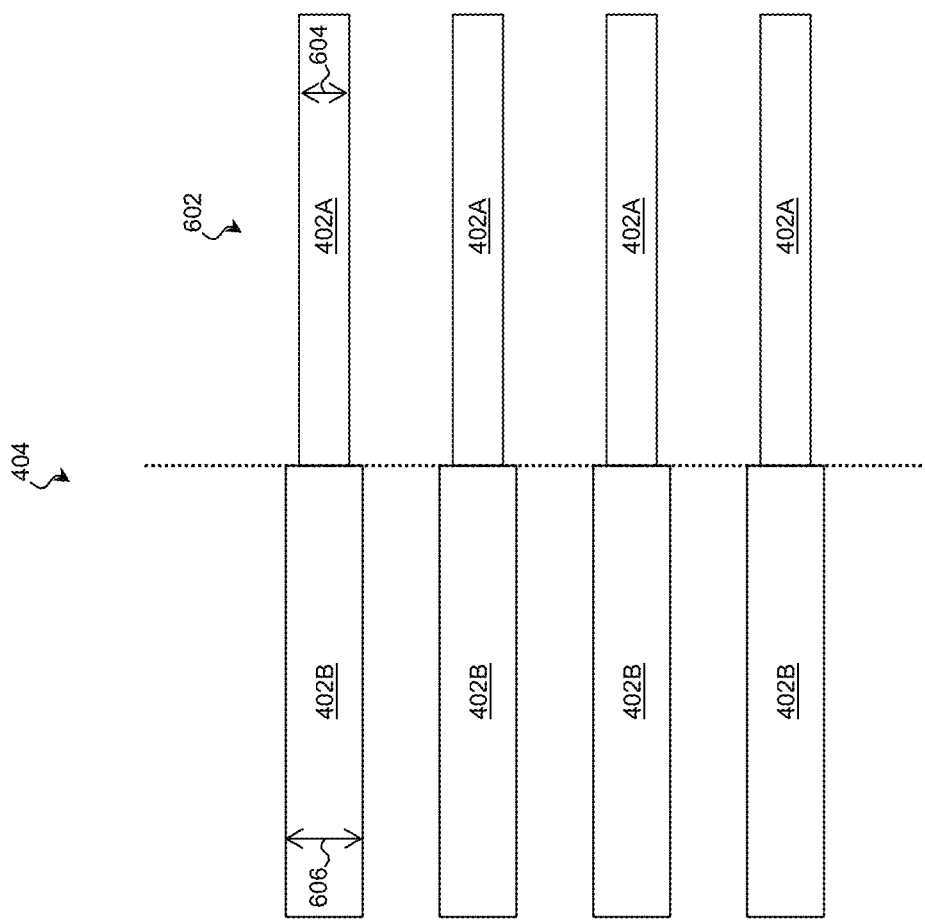

Referring to block 312 of FIG. 3 and to FIG. 6A, stitching zones 602 are defined along the overlapping area between the masks. Referring to block 314 of FIG. 3, shapes 402 within the stitching zones 602 are allocated between the overlapping mask regions 404. In some examples, each mask region 404 will receive an instance of each shape 402 within the mask region's stitching zones 602. This may have the effect of exposing a corresponding photoresist area multiple times as each of the masks is used. Accordingly, in some such examples, the size (e.g., line width) of a portion of a shape 402 within a stitching zone 602 may be smaller than the size of a portion of the same shape 402 outside of the stitching zone 602 so that the total exposure dose remains substantially the same across the feature even though some portions are exposed twice (or more). For example, referring to FIG. 6B, feature portion 402A within the stitching zone 602 has a first width 604 that is less than feature portion 402B outside of the stitching zone 602, which has a second width 606. In some examples, the first width 604 is between about 90% and about 50% of the second width 606, and in one such example, the first width 604 is about 87.5% of the second width 606 (e.g., the second width is 8 nm and the first width 604 is 7 nm).

Additionally or in the alternative, shapes 402 within a stitching zone 602 may be allocated to one of the mask regions 404 that share the stitching zone 602 such that each shape 402 is contained within a single mask region 404, and correspondingly, each feature is exposed using one mask. In some such examples, layout shapes 402 are split along the midline of a stitching zone and shapes 402 and shape portions on one side of the midline are assigned to one mask region 404 while shapes 402 and shape portions on the other side of the midline are assigned to the other mask region 404. In some examples, tracks within the stitching zones 602 are allocated to particular mask regions 404 and any shape 402 within a track is assigned to the corresponding mask region 404. Other examples use other techniques to allocate the shapes 402.

Figure 7:
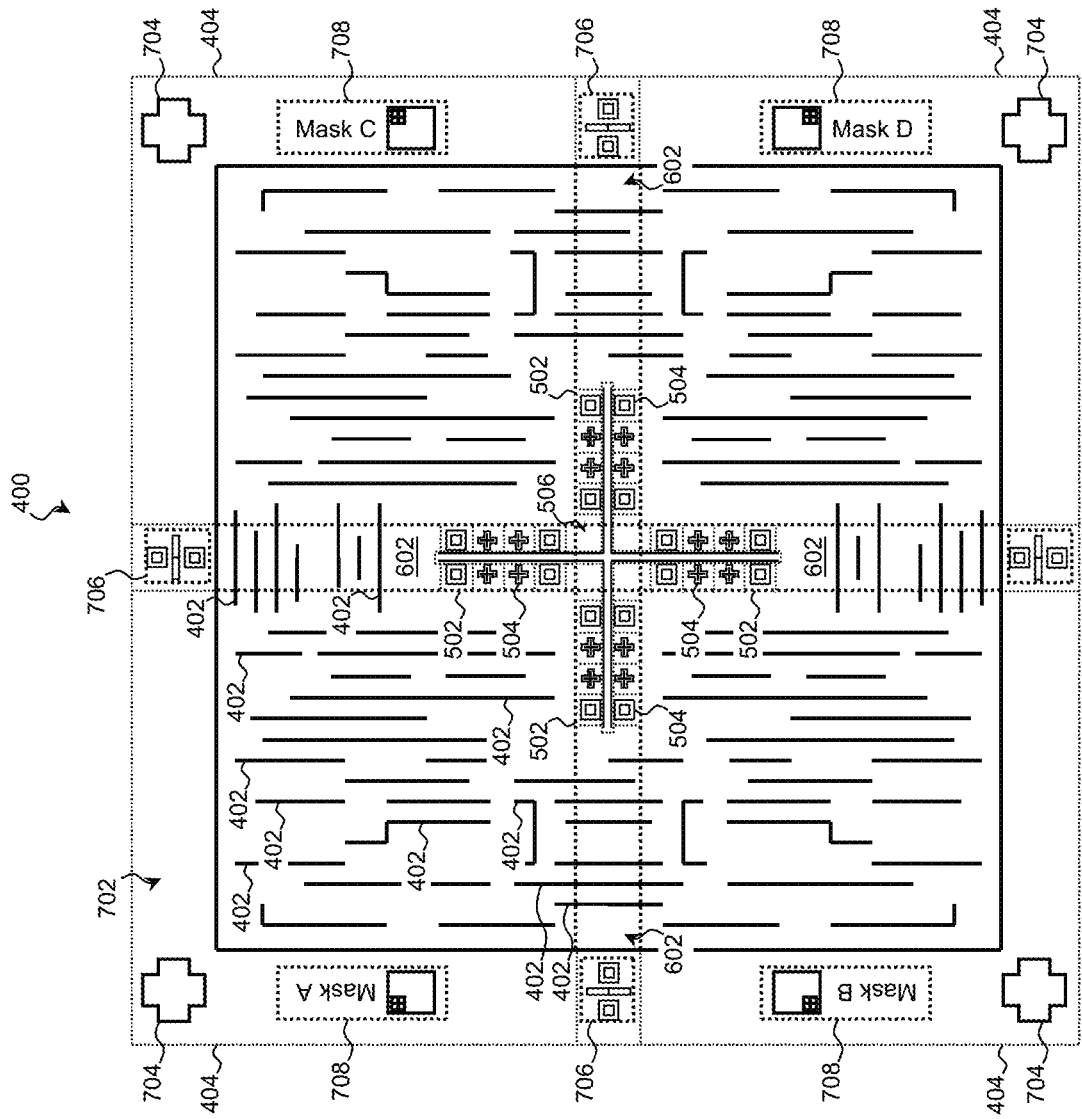

Referring to block 316 of FIG. 3 and to FIG. 7, a frame 702 is defined in the layout 400 and shapes such as scribe shapes, inter-level alignment shapes 704, frame-area in-chip alignment shapes 706, and/or other fiducial shapes 708 are added within the frame 702.

Figure 8:
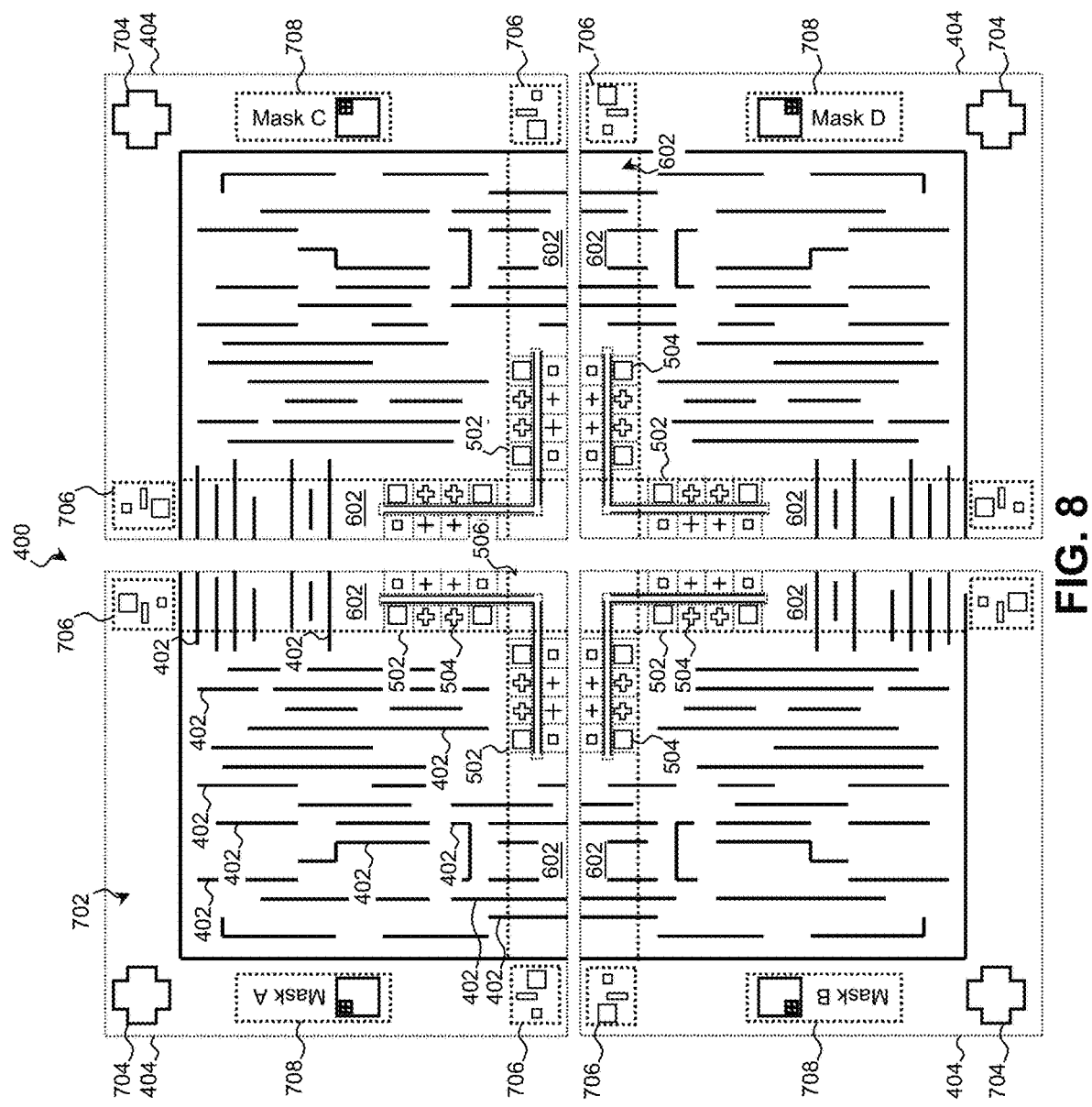

Referring to block 318 of FIG. 3 and to FIG. 8, the mask regions 404 for the individual mask regions 404 are separated. This may include allocating the remaining shapes 402, inter-level alignment shapes 704, frame-area in-chip alignment shapes 706, and fiducial shapes 708 to their respective mask regions 404. In some examples, separating the mask regions 404 includes creating a separate layout for each mask region 404. Additionally or in the alternative, a single layout file may include more than one mask region.

Referring to block 320 of FIG. 3, each of the mask regions 404 is provided for fabricating the respective mask. Fabrication may involve forming a mask 200 with mask features 202 corresponding to the layout shapes 402 in the respective mask region 404, alignment marks 210 corresponding to the alignment shapes 504 in the respective mask region 404, frame-area in-chip alignment marks 228 corresponding to the frame-area in-chip alignment shapes 706 in the respective mask region 404, and/or fiducial features 226 corresponding to the fiducial shapes 708 in the respective mask region 404. Once fabricated, the masks may be used to fabricate an integrated circuit.

Figure 9:
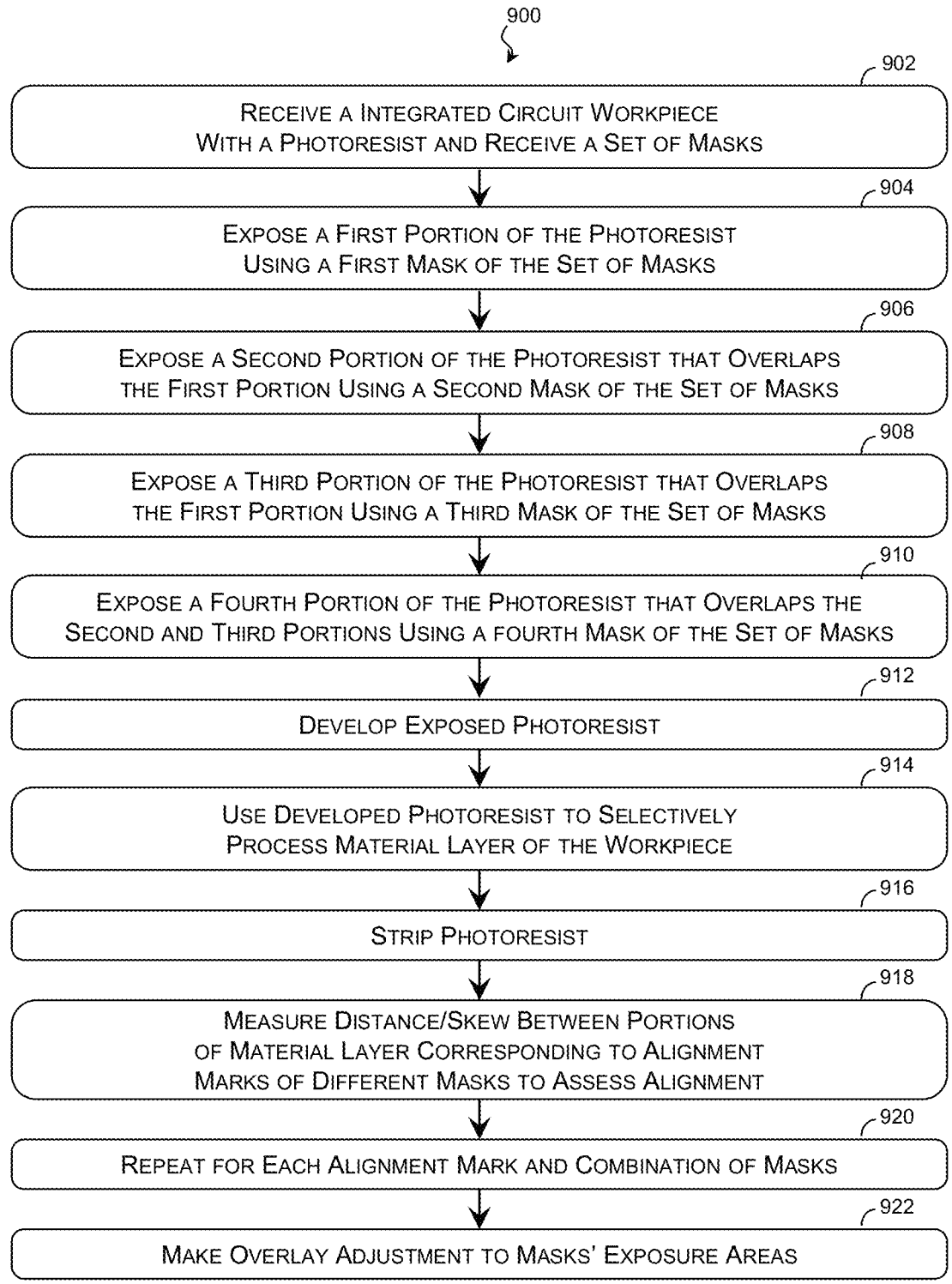
FIG. 9 is a flow diagram of a method of multiple-mask multiple-exposure patterning according to various embodiments of the present disclosure.
Figure 10:
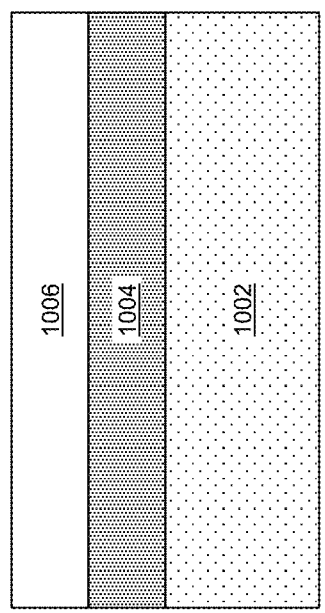
FIG. 10 is a cross-sectional diagram of a portion of an integrated circuit workpiece undergoing a method of multiple-mask multiple-exposure patterning according to various embodiments of the present disclosure.

A technique for performing photolithography using a mask 200 such as that as described above is described with reference to FIGS. 9-17. In that regard, FIG. 9 is a flow diagram of a method 900 of multiple-mask multiple-exposure patterning according to various embodiments of the present disclosure. Additional steps can be provided before, during, and after the method 900, and some of the steps described can be replaced or eliminated for other embodiments of the method 900. FIG. 10 is a cross-sectional diagram of a portion of an integrated circuit workpiece 1000 undergoing the method 900 of multiple-mask multiple-exposure patterning according to various embodiments of the present disclosure. FIGS. 11-17 are top view diagrams of a portion of the integrated circuit workpiece 1000 undergoing the method 900 of multiple-mask multiple-exposure patterning according to various embodiments of the present disclosure.

Referring to block 902 of FIG. 9 and to FIG. 10, an integrated circuit workpiece 1000 and a set of masks for patterning the workpiece 1000 are received. The workpiece 1000 includes a substrate 1002 upon which other layers and features are formed. In various examples, the substrate 1002 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride (CaF2); and/or combinations thereof.

The substrate 1002 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 1002. In some such examples, a layer of the substrate 1002 may include an insulator such as a semiconductor oxide, a semiconductor nitride, a semiconductor oxynitride, a semiconductor carbide, and/or other suitable insulator materials.

In some examples, the workpiece 1000 includes a material layer 1004 disposed on the substrate 1002. In some such examples, the material layer 1004 includes a dielectric layer such as a hard mask dielectric layer, and suitable materials for the dielectric of the material layer 1004 include semiconductor oxides, semiconductor nitrides, semiconductor oxynitrides, semiconductor carbides, and/or other suitable materials. In some examples, the material layer 1004 includes a semiconductor layer such as a silicon layer, or germanium layer, a silicon germanium layer, and/or other suitable semiconductor layers.

The workpiece 1000 may further include a photoresist 1006 disposed on top of the material layer 1004. The photoresist 1006 may be substantially similar to that described above.

Figure 11:
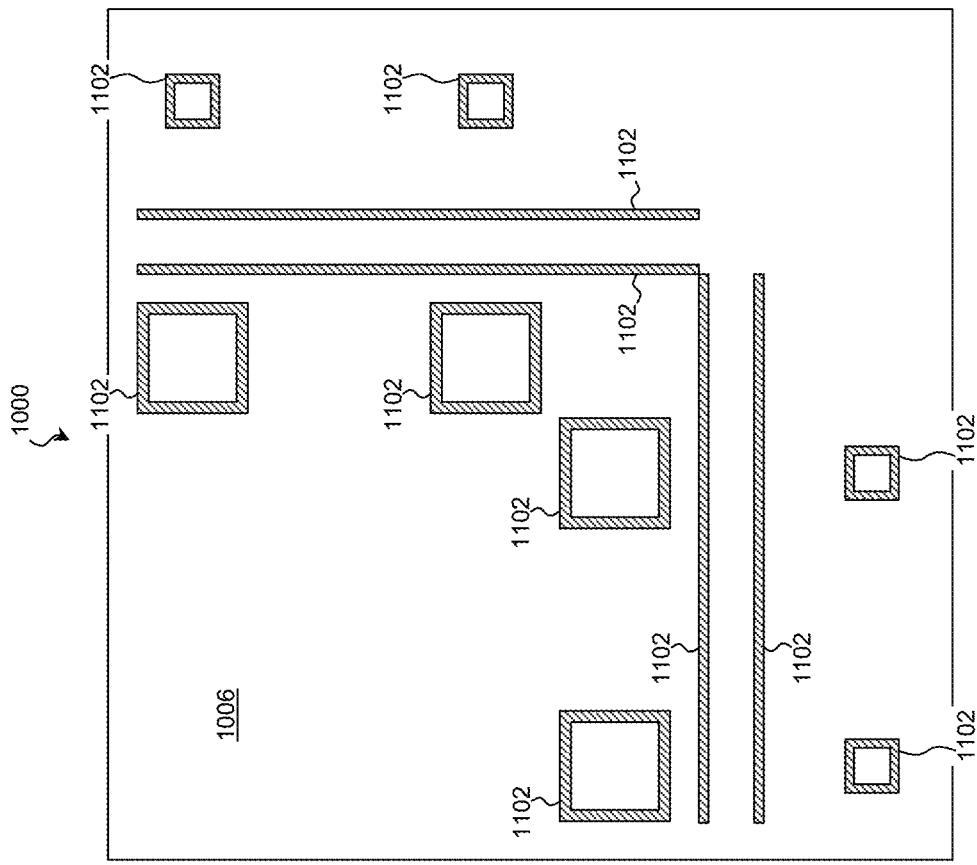
FIGS. 11-17 are top view diagrams of a portion of an integrated circuit workpiece undergoing a method of multiple-mask multiple-exposure patterning according to various embodiments of the present disclosure.

Referring to block 904 of FIG. 9 and to FIG. 11, a first lithographic exposure may be performed on the photoresist 1006 using a lithography system 100 such as that described in FIG. 1. The first lithographic exposure may use a first mask of the set to expose a first portion of the photoresist 1006. The first lithographic exposure may expose the photoresist 1006 according to mask features 202 and alignment marks (such as alignment marks 210A-210E and/or frame-area in-chip alignment marks 228 above) present in the first mask. Regions of the photoresist 1006 exposed by the alignment marks of the first mask are indicated by marker 1102 and are shaded for clarity. As the first mask may include any number of alignment marks aligned in parallel with a boundary between the exposed area of a first mask and an exposed area of a second mask and any number of alignment marks aligned in parallel with a boundary between the first mask and a third mask, the photoresist 1006 may have any number of exposed regions 1102. In various examples, the regions 1102 correspond to an inner box of a box-in-box pattern, an outer box of a box-in-box pattern, an inner cross of a cross-in-cross pattern, an outer cross of a cross-in-cross pattern, and/or test lines of a set of parallel or abutting test lines.

Figure 12:
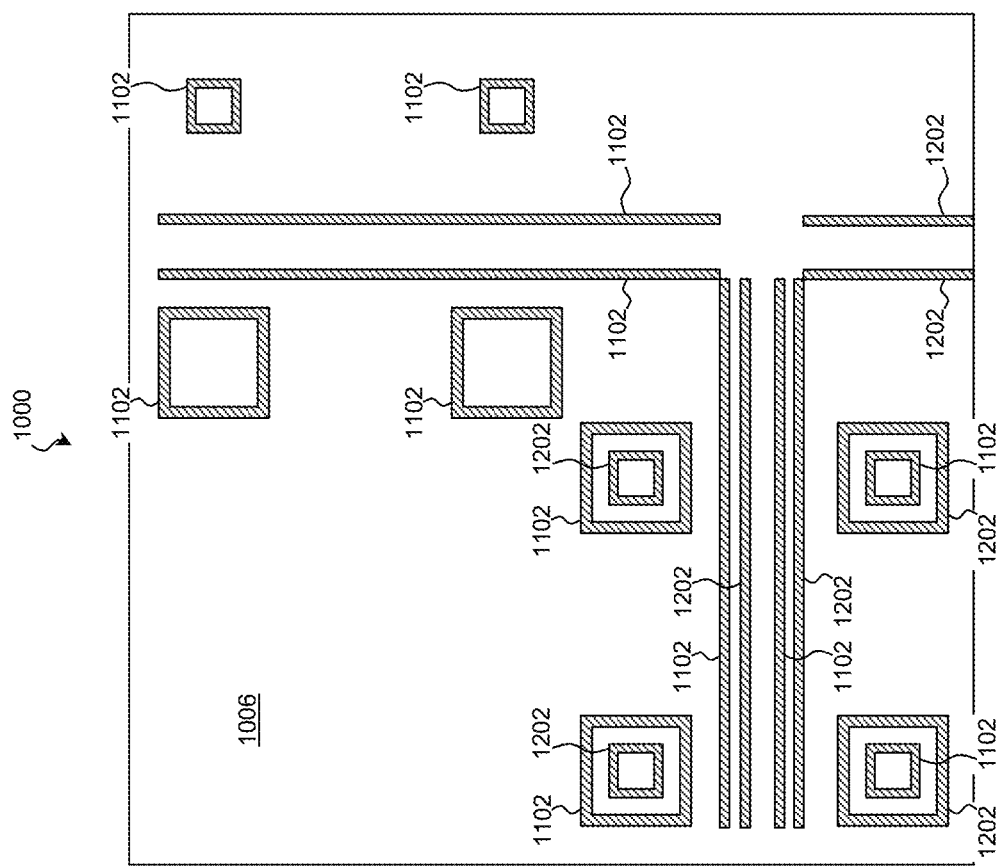

Referring to block 906 of FIG. 9 and to FIG. 12, a second lithographic exposure may be performed on a second portion of the photoresist 1006 using the lithography system 100 and the second mask. In some examples, the second portion exposed by the second mask overlaps the first portion exposed by the first mask. As with the first exposure, the second lithographic exposure may pattern the photoresist 1006 according to mask features 202 and alignment marks (such as alignment marks 210A-210E and/or frame-area in-chip alignment marks 228 above) present in the second mask. Regions of the photoresist 1006 exposed by the alignment marks of the second mask are indicated by marker 1202 and are shaded for clarity. As the second mask may include any number of alignment marks aligned in parallel with a boundary between the first mask and the second mask, the photoresist 1006 may have any number of exposed regions 1202. In various examples, the regions 1202 correspond to an inner box of a box-in-box pattern, an outer box of a box-in-box pattern, an inner cross of a cross-in-cross pattern, an outer cross of a cross-in-cross pattern, and/or test lines of a set of parallel or abutting test lines.

Figure 13:
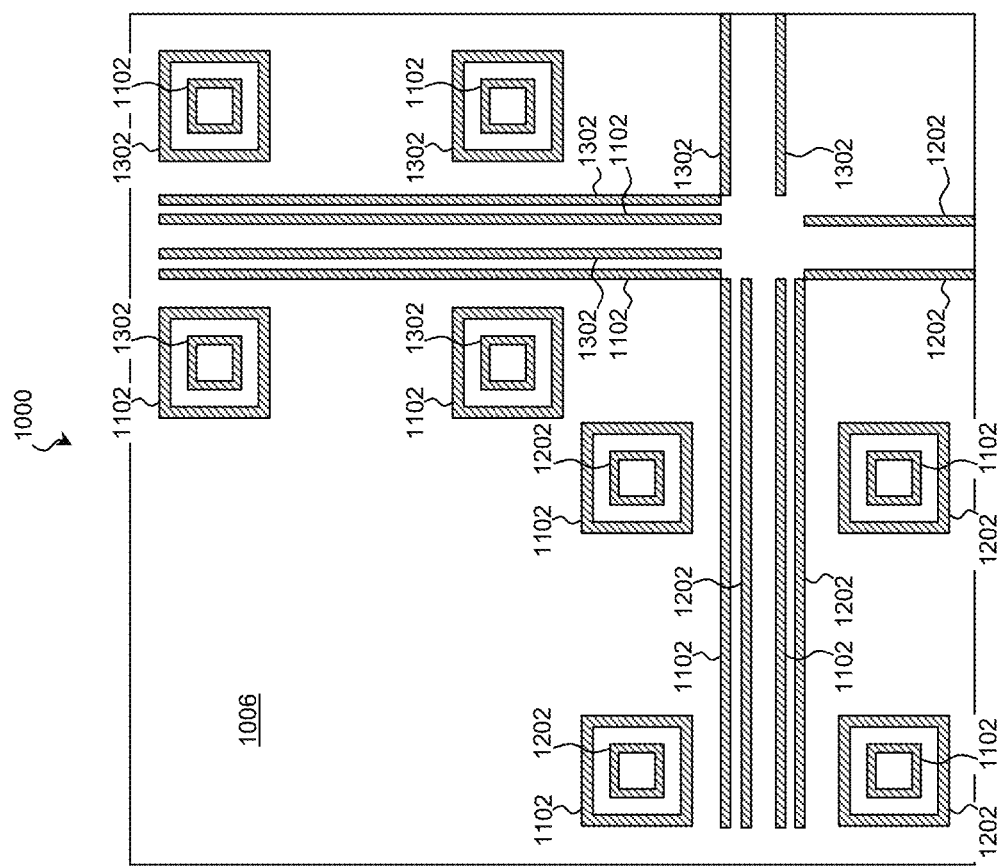

Referring to block 908 of FIG. 9 and to FIG. 13, a third lithographic exposure may be performed on a third portion of the photoresist 1006 using the lithography system 100 and a third mask. In some examples, the third portion exposed by the third mask overlaps the first portion exposed by the first mask. The third lithographic exposure may pattern the photoresist 1006 according to mask features 202 and alignment marks (such as alignment marks 210A-210E and/or frame-area in-chip alignment marks 228 above) present in the third mask. Regions of the photoresist 1006 exposed by the alignment marks of the third mask are indicated by marker 1302 and are shaded for clarity. As the third mask may include any number of alignment marks aligned in parallel with a boundary between the first mask and a fourth mask, the photoresist 1006 may have any number of exposed regions 1302. In various examples, the regions 1302 correspond to an inner box of a box-in-box pattern, an outer box of a box-in-box pattern, an inner cross of a cross-in-cross pattern, an outer cross of a cross-in-cross pattern, and/or test lines of a set of parallel or abutting test lines.

Figure 14:
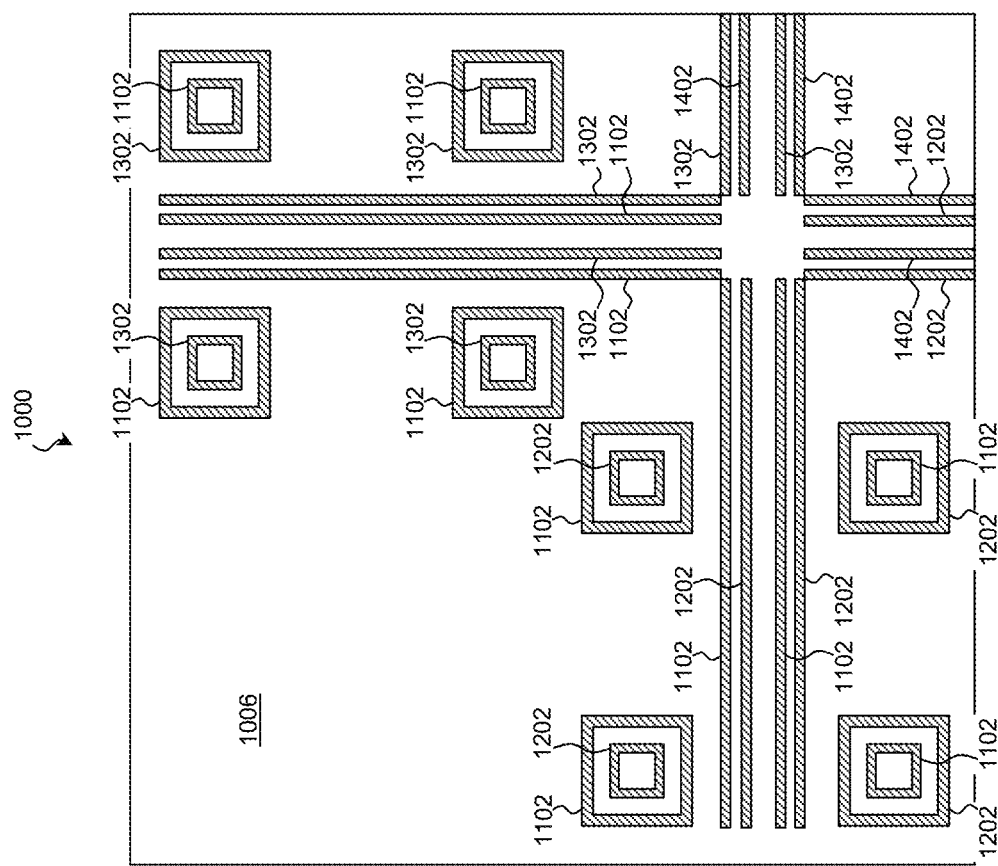

Referring to block 910 of FIG. 9 and to FIG. 14, a fourth lithographic exposure may be performed on a fourth portion of the photoresist 1006 using the lithography system 100 and a third mask. In some examples, the fourth portion exposed by the fourth mask overlaps the second portion and the third portion. The fourth lithographic exposure may pattern the photoresist 1006 according to mask features 202 and alignment marks (such as alignment marks 210A-210E and/or frame-area in-chip alignment marks 228 above) present in the fourth mask. Regions of the photoresist 1006 exposed by the alignment marks of the fourth mask are indicated by marker 1402 and are shaded for clarity. As the fourth mask may include any number of alignment marks aligned in parallel with a boundary between the second mask and the third mask, the photoresist 1006 may have any number of exposed regions 1402. In various examples, the regions 1402 correspond to an inner box of a box-in-box pattern, an outer box of a box-in-box pattern, an inner cross of a cross-in-cross pattern, an outer cross of a cross-in-cross pattern, and/or test lines of a set of parallel or abutting test lines.

In some such examples, the photoresist 1006 regions exposed by the mask features 202 of the first mask, the regions exposed by the mask features 202 of the second mask, the regions exposed by the mask features 202 of the third mask, and the regions exposed by the mask features 202 of the fourth mask form circuit features for a single monolithic integrated circuit.

The processes of blocks 904-910 may be repeated for as many masks and as many exposures are used to pattern the workpiece 1000.

Figure 15:
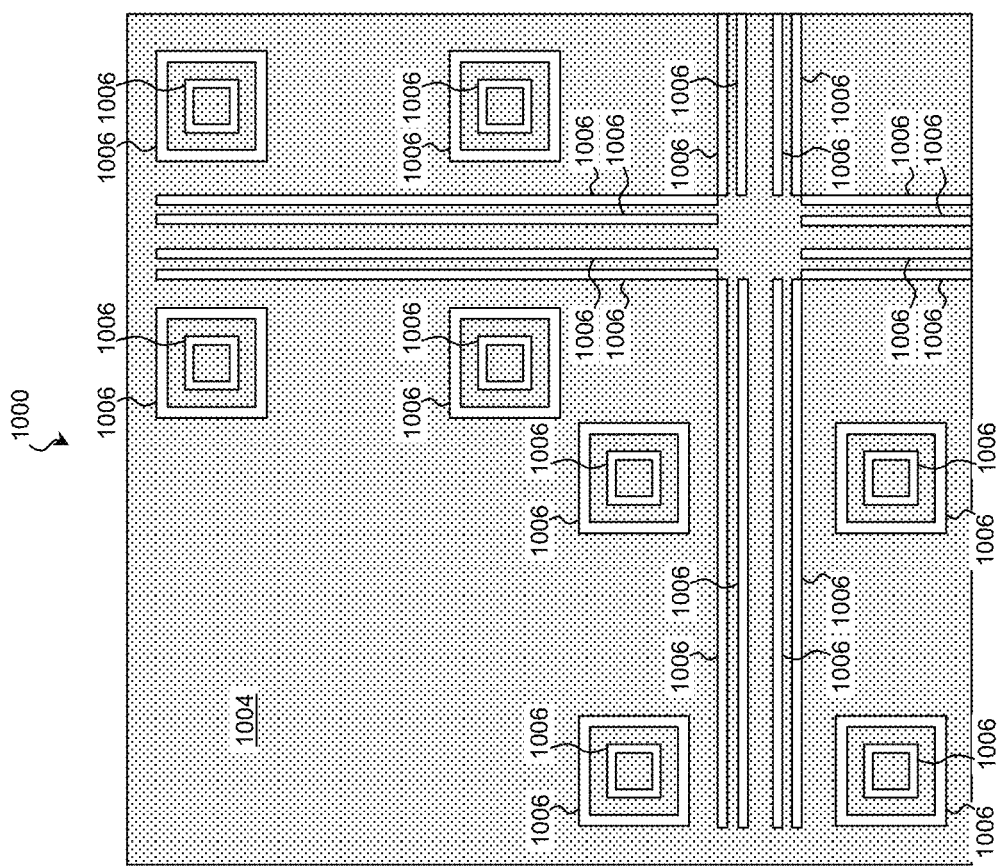
Figure 16:
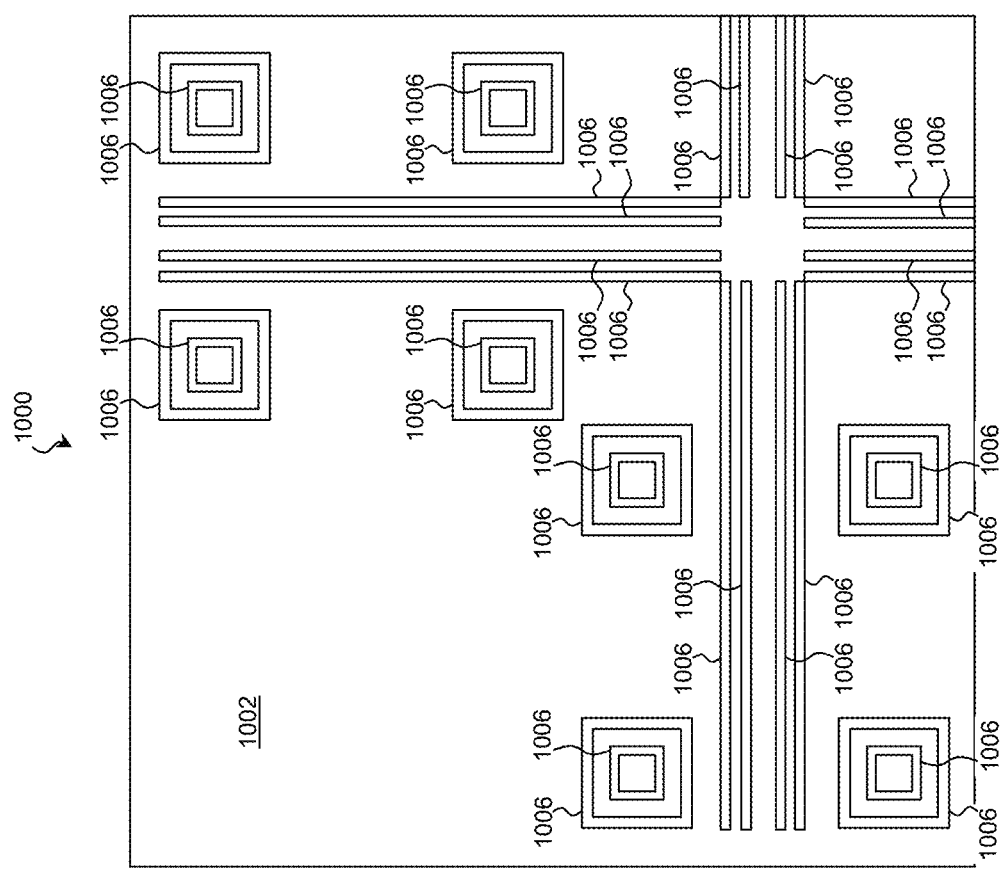

Referring to block 912 of FIG. 9 and to FIG. 15, after the final lithographic exposure, the photoresist 1006 is developed. The developing process may leave only those portions of the photoresist 1006 that were exposed or may leave only those portions of the photoresist layer that were not exposed. Referring to block 914 of FIG. 9 and to FIG. 16, the patterned photoresist is used to selectively process exposed portions of the material layer 1004. In some examples, this includes etching the exposed portion of the material layer 1004 to expose the substrate 1002 underneath. In further examples, processing the exposed portions of the material layer 1004 includes doping the material layer 1004, depositing another material upon the material layer 1004, epitaxially growing material upon the material layer 1004, and/or other suitable circuit fabrication processes. Referring to block 916 of FIG. 9 and to FIG. 17, the photoresist 1006 may be removed after the material layer 1004 is processed.

Figure 17:
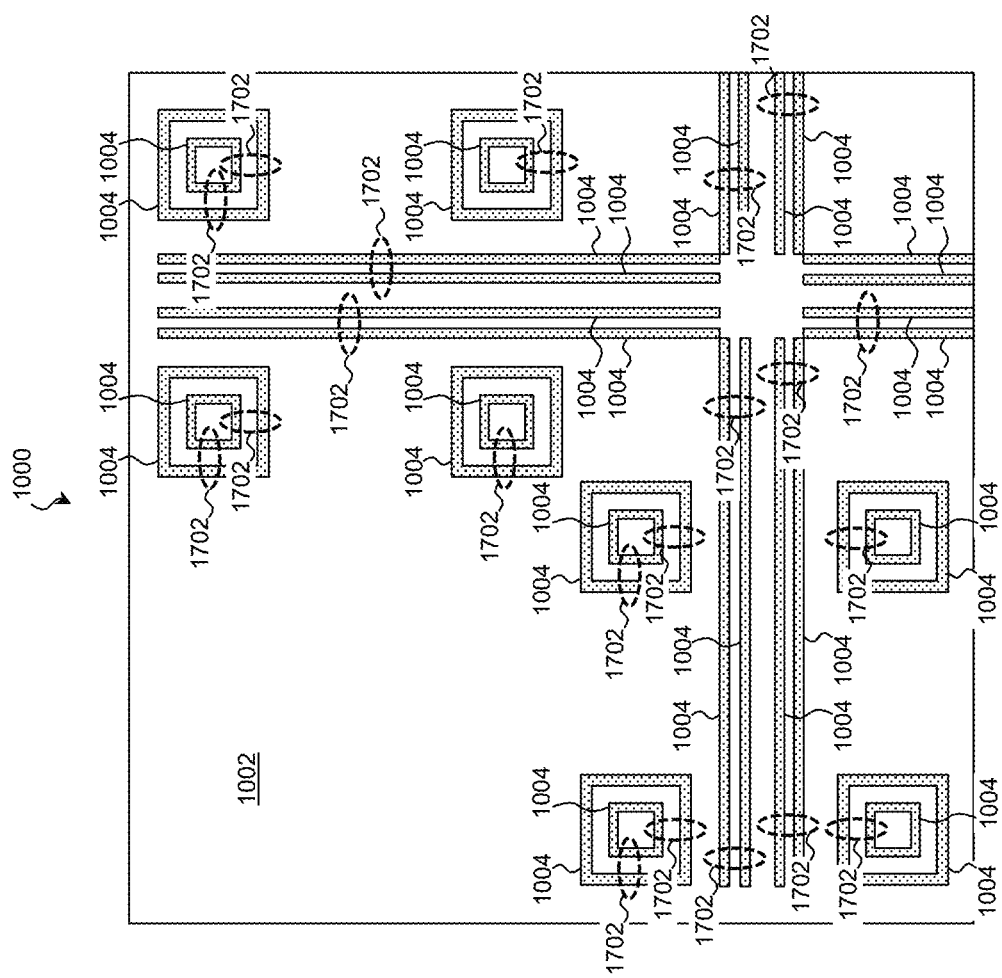

As can be seen in FIG. 17, portions of the processed material layer 1004 correspond to the alignment marks of the first mask, second mask, third mask, and fourth mask. Referring to block 918 of FIG. 9, the alignment between the first mask and the second mask is analyzed by measuring the distance and/or skew between a portion of the processed material layer 1004 corresponding to an alignment mark of the first mask and a portion corresponding to an alignment mark of the second mask as indicated by marker 1702. The distance may be measured at more than one location between the two portions. The measurements of block 918 may be repeated for each alignment mark and each combination of masks as shown in block 920. Referring to block 922 of FIG. 9, an overlay adjustment is made to the alignment of the masks' exposure areas relative to one another for subsequent workpieces.

Figure 18:
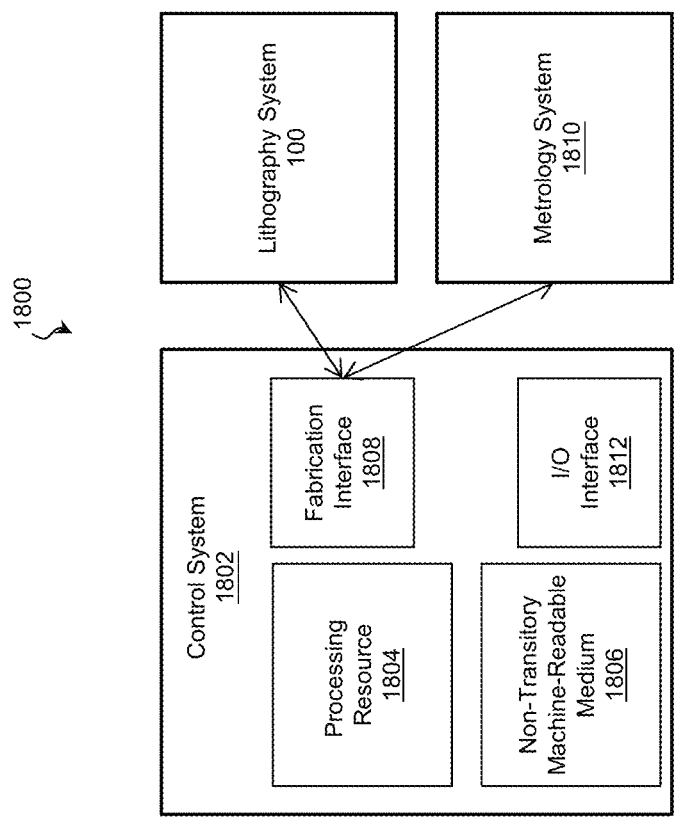
FIG. 18 is a block diagram of a lithographic environment according to various embodiments of the present disclosure.

In various embodiments, the technique is performed by using combinations of dedicated, fixed-function computing elements and programmable computing elements executing software instructions. Accordingly, it is understood that any of the steps of method 300 and/or method 900 may be implemented by a computing system using corresponding instructions stored on or in a non-transitory machine-readable medium accessible by the processing system. Examples of such a system and non-transitory machine-readable medium are described with reference to FIG. 18. In that regard, FIG. 18 is a block diagram of a lithographic environment 1800 according to various embodiments of the present disclosure.

The lithographic environment 1800 includes a control system 1802. The control system 1802 includes a processing resource 1804 that may include any number and type of processing elements such as Central Processing Units (CPUs) Graphical Processing Units (GPUs), Application-Specific Integrated Circuits (ASICs), microcontrollers, and/or other suitable processing elements. The processing resource 1804 is coupled to a tangible non-transitory machine-readable medium 1806 to execute instructions stored on the medium 1806. For the purposes of this description, the tangible non-transitory machine-readable medium 1806 can be any apparatus that can store the program for use by or in connection with the instruction execution system, apparatus, or device. The medium 1806 may include non-volatile memory including magnetic storage, solid-state storage, optical storage, cache memory, and/or battery-backed Random Access Memory (RAM). In various examples, the medium 1806 stores instructions that cause the processing resource 1804 to perform the processes of method 300 of forming a mask set from a layout and/or the processes of method 900 of multiple-mask multiple-exposure patterning.

For that purpose, the control system 1802 may include a lithography interface 1808 that sends and receives signals a lithography system 100 and/or a metrology system 1810. The control system 1802 may also include an I/O interface 1812 for communicating test information and results with a user and/or other computing systems. Accordingly the I/O interface 1812 may include controllers for video output (e.g., a GPU), user input (e.g., controllers for a keyboard, a mouse, a pen input device, a touchpad, etc.), network controllers (e.g., Ethernet and/or wireless communication controllers), and/or other suitable I/O controllers.

Thus, the present disclosure provides examples of a technique for performing a multiple-mask multiple-exposure lithographic technique on a workpiece and provides examples of suitable masks. In some examples, a photomask includes a die area and a stitching region disposed adjacent to the die area and along a boundary of the photomask. The stitching region includes a mask feature for forming an integrated circuit feature and an alignment mark for in-chip overlay measurement. In some such examples, the stitching region further includes a first plurality of alignment marks that includes the alignment mark, and the first plurality of alignment marks are arranged in parallel with the boundary. In some such examples, the stitching region further includes a second plurality of alignment marks arranged in parallel with the boundary and disposed between the first plurality of alignment marks and the boundary. In some such examples, the first plurality of alignment marks includes an outer box of a first box-in-box pattern, and the second plurality of alignment marks includes an inner box of a second box-in-box pattern. In some such examples, the boundary is a first boundary of the photomask, the alignment mark is a first alignment mark and is for in-chip overlay measurement with respect to a first adjacent photomask, and the stitching region is a first stitching region and is to overlap with an exposure area of the first adjacent photomask. The photomask further includes a second stitching region disposed adjacent to the die area and along a second boundary of the photomask, and the second stitching region is to overlap with an exposure area of a second adjacent photomask and includes a second alignment mark for in-chip overlay measurement with respect to the second adjacent photomask. In some such examples, the first boundary is perpendicular to the second boundary. In some such examples, the alignment mark is a first alignment mark and is for in-chip overlay measurement with respect to a first adjacent photomask, the photomask further includes a frame area around the die area, and the frame area includes a second alignment mark for in-chip overlay measurement with respect to the first adjacent photomask. In some such examples, the mask feature extends to the boundary. In some such examples, the mask feature extends into the die area.

In further examples, a mask includes a plurality of mask features extending to a boundary of the mask and a first plurality of alignment regions containing a first plurality of in-chip alignment features aligned in parallel with the boundary. The first plurality of alignment regions overlap with an exposure area of an adjacent mask, and the first plurality of in-chip alignment features are for overlay measurement with respect to the adjacent mask. In some such examples, the mask further includes a second plurality of alignment regions containing a second plurality of in-chip alignment features aligned in parallel with the boundary disposed between the first plurality of alignment regions and the boundary. In some such examples, the mask further includes a test line extending in parallel with the boundary and disposed between the first plurality of alignment regions and the second plurality of alignment regions, and the test line is for overlay measurement with respect to the adjacent mask. In some such examples, the boundary is a first boundary, the adjacent mask is a first adjacent mask, and the mask further includes a second plurality of alignment regions containing a second plurality of in-chip alignment features aligned in parallel with a second boundary. The second plurality of alignment regions overlap with an exposure area of a second adjacent mask, and the second plurality of in-chip alignment features are for overlay measurement with respect to the second adjacent mask. In some such examples, the first plurality of in-chip alignment features include a feature from a group consisting of: an inner box alignment feature, an outer box alignment feature, an inner cross alignment feature, an outer cross alignment feature, and a test line. In some such examples, the mask further includes a frame area, and the frame area includes an alignment feature for overlay measurement with respect to the adjacent mask.

In further examples, a method includes: receiving a layout that includes functional shapes corresponding to features of a mask for forming functional features of an integrated circuit; dividing the layout into a plurality of overlapping mask regions; defining alignment zones in the layout at boundaries between regions of the plurality of overlapping mask regions; inserting alignment shapes into the alignment zones; allocating the functional shapes and the alignment shapes among the plurality of overlapping mask regions; and providing the plurality of overlapping mask regions for fabricating masks of a multiple-mask multiple-exposure mask set. In some such examples, the alignment shapes are disposed among the functional shapes. In some such examples, the allocating of the alignment shapes includes allocating an inner box of a box-in-box pattern to a first region of the plurality of overlapping mask regions, and allocating an outer box of the box-in-box pattern to a second region of the plurality of overlapping mask regions. In some such examples, the allocating of the alignment shapes allocates a first plurality of alignment shapes to a first region of the plurality of overlapping mask regions, and the first plurality of alignment shapes are arranged in parallel with a boundary of the first region. In some such examples, the allocating of the alignment shapes further allocates a second plurality of alignment shapes to the first region; and second plurality of alignment shapes are arranged in parallel with the boundary of the first region and are disposed between the first plurality of alignment shapes and the boundary.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    receiving a layout of an integrated circuit that includes functional shapes corresponding to functional features of the integrated circuit;
    dividing the layout into a first mask region and a second mask region, wherein a first region of the first mask region overlaps with a second region of the second mask region;
    defining a first alignment zone within the first region and a second alignment zone within the second region;
    allocating a first alignment shape in the first alignment zone and a second alignment shape within the second alignment zone;
    defining a first stitching zone within the first region and a second stitching zone within the second region;
    allocating a first functional shape in the first stitching zone and a second functional shape within the second stitching zone;
    separating the first mask region from the second mask region; and
    fabricating a first mask based on the first mask region such that the first mask includes a first mask feature corresponding to the first functional shape and a first alignment mark corresponding to the first alignment shape.

2. The method of claim 1, further comprising fabricating a second mask based on the second mask region such that the second mask includes a second mask feature corresponding to the second functional shape and a second alignment mark corresponding to the second alignment shape.

3. The method of claim 2, further comprising:
    performing a first exposure process using the first mask to expose a first portion of a photosensitive material; and
    performing a second exposure process using the second mask to expose a second portion of the photosensitive material, wherein the second portion of the photosensitive material overlaps the first portion of the photosensitive material.

4. The method of claim 1, wherein the allocating of the second functional shape within the second stitching zone includes allocating the first functional shape within the second stitching zone.

5. The method of claim 1, wherein the first alignment shape includes an outer box of a box-in-box pattern, and
    wherein the second alignment shape includes an inner box of the box-in-box pattern.

6. The method of claim 1, further comprising:
    determining whether any functional shape elements are within the first alignment zone; and
    removing any function shape elements from the first alignment zone.

7. The method of claim 1, further comprising:
    defining a first frame area within the first mask region; and allocating a first inter-level alignment shape to the first frame area.

8. A method comprising:
receiving a layout of an integrated circuit that includes functional shapes corresponding to functional features of the integrated circuit;
dividing the layout into a first mask region and a second mask region, wherein a first region of the first mask region overlaps with a second region of the second mask region;
allocating a first alignment shape to the first region and a second alignment shape to the second region;
determining that the layout requires a first functional shape to be allocated to the first region and the second region;
allocating the first functional shape to only the first region after determining that the layout requires the first functional shape to be allocated to the first region and the second region; and
fabricating a first mask based on the first mask region and a second mask based on the second mask region.

9. The method of claim 8, further comprising:
determining that the layout requires a second functional shape to be allocated to the first region and the second region;
allocating the second functional shape to the first region and the second region.

10. The method of claim 9, wherein the second functional shape extends to a first die area of the first mask region,
wherein the second functional shape has a first width in the first die area and a second width in the first region that is less than the first width.

11. The method of claim 9, wherein the second functional shape extends to a second die area of the second mask region,
wherein the second functional shape has a third width in the second die area and a fourth width in the second region that is less than the third width.

12. The method of claim 8, wherein the allocating of the first alignment shape to the first region and the second alignment shape to the second region includes allocating a third alignment shape to the first region and a fourth alignment shape to the second region, and
wherein the first alignment shape is different than the third alignment shape and the second alignment shape is different than the fourth alignment shape.

13. The method of claim 8, wherein the first alignment shape includes a feature selected from the group consisting of an inner box alignment feature, an outer box alignment feature, an inner cross alignment feature, an outer cross alignment feature, and a test line.

14. The method of claim 8, further comprising:
performing a first exposure process using the first mask to expose a first portion of a photosensitive material; and
performing a second exposure process using the second mask to expose a second portion of the photosensitive material, wherein the second portion of the photosensitive material overlaps the first portion of the photosensitive material.

15. The method of claim 8, further comprising separating the first mask region from the second mask region.

16. A method comprising:
receiving a layout that includes functional shapes corresponding to features of a mask for forming functional features of an integrated circuit;
dividing the layout into a plurality of overlapping mask regions;
defining alignment zones in the layout at boundaries between regions of the plurality of overlapping mask regions;
inserting alignment shapes into the alignment zones;
allocating the functional shapes and the alignment shapes among the plurality of overlapping mask regions; and
providing the plurality of overlapping mask regions for fabricating masks of a multiple-mask multiple-exposure mask set.

17. The method of claim 16, wherein the alignment shapes are disposed among the functional shapes.

18. The method of claim 16, wherein the allocating of the alignment shapes includes:
allocating an inner box of a box-in-box pattern to a first region of the plurality of overlapping mask regions; and
allocating an outer box of the box-in-box pattern to a second region of the plurality of overlapping mask regions.

19. The method of claim 16, wherein:
the allocating of the alignment shapes allocates a first plurality of alignment shapes to a first region of the plurality of overlapping mask regions; and
the first plurality of alignment shapes are arranged in parallel with a boundary of the first region.

20. The method of claim 19, wherein:
the allocating of the alignment shapes further allocates a second plurality of alignment shapes to the first region; and
the second plurality of alignment shapes are arranged in parallel with the boundary of the first region and are disposed between the first plurality of alignment shapes and the boundary.

\* \* \* \* \*